(12) United States Patent
Ito et al.

(10) Patent No.: US 8,003,309 B2
(45) Date of Patent: Aug. 23, 2011

(54) PHOTORESIST COMPOSITIONS AND METHODS OF USE IN HIGH INDEX IMMERSION LITHOGRAPHY

(75) Inventors: Hiroshi Ito, San Jose, CA (US); Daniel Paul Sanders, San Jose, CA (US); Linda Karin Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 765 days.

(21) Appl. No.: 12/015,436

(22) Filed: Jan. 16, 2008

(65) Prior Publication Data
US 2009/0181321 A1  Jul. 16, 2009

(51) Int. Cl.
*G03F 7/00* (2006.01)
(52) U.S. Cl. ..................... 430/322; 430/270.1
(58) Field of Classification Search .............. 430/322
See application file for complete search history.

(56) References Cited

U.S. PATENT DOCUMENTS

| | | |
|---|---|---|
| 7,232,917 B2 | 6/2007 | Sumida et al. |
| 7,700,260 B2 | 4/2010 | Kanna |
| 2005/0227173 A1 | 10/2005 | Hatakeyama |
| 2005/0227174 A1 | 10/2005 | Hatakeyama |
| 2005/0286031 A1 | 12/2005 | French |
| 2006/0029884 A1 | 2/2006 | Hatakeyama |
| 2006/0094817 A1 | 5/2006 | Harada |
| 2006/0177765 A1 | 8/2006 | Harada |
| 2006/0188804 A1 | 8/2006 | Allen |
| 2006/0275697 A1 | 12/2006 | Hata |
| 2006/0292484 A1 | 12/2006 | Hiroshi |
| 2007/0026341 A1 | 2/2007 | Hatakeyama |
| 2007/0172761 A1 | 7/2007 | Takahashi et al. |
| 2007/0215846 A1 * | 9/2007 | French et al. ............ 252/589 |
| 2007/0254235 A1 | 11/2007 | Allen |
| 2008/0194764 A1 | 8/2008 | Komoriya et al. |

FOREIGN PATENT DOCUMENTS
EP     1754999 A2 *  2/2007
WO   2005098541 A1   10/2005

OTHER PUBLICATIONS

Sanders et al., "Fluoroalcohol Material with Tailored Interfacial Properties for Immersion Lithography", Proc of SPIE, 2007, pp. 651904-1-651904-12, vol. 6519, USA.
Sanders et al., "Topcoat-free photoresists for 193nm immersion lithography", Microlithography World, Aug. 2002, pp. 8-13, vol. 16, No. 3, USA.

* cited by examiner

*Primary Examiner* — Cynthia H Kelly
*Assistant Examiner* — Connie P Johnson
(74) *Attorney, Agent, or Firm* — Karen Canaan; CanaanLaw, P.C.

(57) ABSTRACT

The present invention relates to a composition comprising a photoresist polymer and a fluoropolymer. In one embodiment, the fluoropolymer comprises a first monomer having a pendant group selected from alicyclic bis-hexafluoroisopropanol and aryl bis-hexafluoroisopropanol and preferably a second monomer selected from fluorinated styrene and fluorinated vinyl ether. The invention composition has improved receding contact angles with high refractive index hydrocarbon fluids used in immersion lithography and, thereby, provides improved performance in immersion lithography.

1 Claim, 10 Drawing Sheets

Contact Angles of Fluoroalchol Functionalized Polymers

| Polymer | Water | | | | JSR HIL-001 | | | | Bicyclohexyl | | | |
|---|---|---|---|---|---|---|---|---|---|---|---|---|
| | $\theta_{static}$ | $\theta_{adv.}$ | $\theta_{rec.}$ | $\theta_{tilt.}$ | $\theta_{static}$ | $\theta_{adv.}$ | $\theta_{rec.}$ | $\theta_{tilt.}$ | $\theta_{static}$ | $\theta_{adv.}$ | $\theta_{rec.}$ | $\theta_{tilt.}$ |
| NBHFAMA | 76.9 | 80.6 | 65.1 | 14.2 | 25.2 | 27.4 | 9.3 | 4.9 | 30.4 | 32.8 | 21.5 | 4.6 |
| tBuiPrHFAMA | 97.6 | 97.7 | 82.9 | 12.8 | 38.9 | 41.7 | 11.9 | 10.0 | 43.4 | 45.3 | 11.7 | 12.2 |
| CHiPrHFAMA | 95.9 | 92.7 | 78.7 | 14.4 | 25.3 | 28.0 | 8.0 | 6.3 | 32.9 | 34.5 | 14.7 | 7.4 |
| iPriPrHFAMA | 93.2 | 93.3 | 79.6 | 12.4 | 39.1 | 39.5 | 12.6 | 9.4 | 45.4 | 48.6 | 18.6 | 11.0 |
| EtiPrHFAMA | 88.2 | 90.1 | 71.9 | 16.0 | 39.1 | 41.4 | 13.9 | 10.8 | 45.6 | 48.3 | 17.3 | 11.7 |
| iPrHFAMA | 82.4 | 85.4 | 65.8 | 18.0 | 40.8 | 41.7 | 19.5 | 8.7 | 49.4 | 52.3 | 21.8 | 11.1 |
| nPrHFAMA | 71.0 | 77.0 | 50.1 | 24.1 | 34.9 | 38.2 | 27.1 | 4.7 | 41.6 | 44.1 | 27.1 | 7.5 |
| BisHFACHMA | 68.8 | 76.4 | 50.4 | 23.2 | 44.9 | 50.5 | 39.8 | 2.8 | 48.9 | 54.0 | 26.8 | 1.3 |

FIG. 2

Contact Angles of Fluoropolymers

| Additive | Water | | | JSR HIL-001 | | | | Bicyclohexyl | | | |
|---|---|---|---|---|---|---|---|---|---|---|---|
| | $\theta_{static}$ | $\theta_{adv.}$ | $\theta_{rec.}$ | $\theta_{tilt.}$ | $\theta_{static}$ | $\theta_{adv.}$ | $\theta_{rec.}$ | $\theta_{tilt.}$ | $\theta_{static}$ | $\theta_{adv.}$ | $\theta_{rec.}$ | $\theta_{tilt.}$ |
| polymer 1 | 68.8 | 76.4 | 50.4 | 23.2 | 44.9 | 50.5 | 39.8 | 2.8 | 48.9 | 54.0 | 26.8 | 1.3 |
| polymer 2 | - | 75.5 | 42.7 | 29.3 | 43.2 | 47.1 | 38.4 | 2.3 | 47.2 | 59.8 | 25.8 | 10.7 |
| polymer 3 | 72.7 | 76.3 | 56.0 | 18.8 | - | 44.8 | 37.4 | 2.2 | - | 51.4 | 43.0 | 2.4 |
| polymer 4 | 76.1 | 81.9 | 56.7 | 23.0 | 47.3 | 49.9 | 39.0 | 3.7 | 51.4 | 54.8 | 31.9 | 9.5 |
| polymer 5 | 87.3 | 88.9 | 62.9 | 24.7 | 51.4 | 55.3 | 42.2 | 3.3 | 53.8 | 56.1 | 35.9 | 8.8 |
| polymer 6 | 64.8 | 74.5 | 51.6 | 23.0 | 54.8 | 52.6 | 43.0 | 2.7 | 54.1 | 52.5 | 31.8 | 8.2 |
| polymer 7 | 80.0 | 86.2 | 62.0 | 24.0 | 55.8 | 54.6 | 45.4 | 3.4 | 54.4 | 55.6 | 35.7 | 8.5 |
| polymer 8 | 73.5 | 77.4 | 60.4 | 16.5 | 46.4 | 43.0 | 36.7 | 2.7 | 46.8 | 44.3 | 29.5 | 7.0 |
| polymer 9 | 39.1 | 51.1 | 24.7 | 19.3 | 60.0 | 50.2 | 41.3 | 2.8 | 48.4 | 46.2 | 30.8 | 8.5 |
| polymer 10 | 76.7 | 85.7 | 36.8 | 44.2 | 47.4 | 50.1 | 41.6 | 2.4 | 51.4 | 56.3 | 25.5 | 11.3 |
| polymer 11 | 82.9 | 84.0 | 57.1 | 28.0 | 52.9 | 55.7 | 48.7 | 2.2 | 57.4 | 61.3 | 36.6 | 9.6 |
| polymer 12 | 103.1 | 105.9 | 69.4 | 30.5 | 65.3 | 62.9 | 50.4 | 4.9 | 65.3 | 66.4 | 38.7 | 14.4 |
| polymer 13 | 96.7 | 101.6 | 63.8 | 36.9 | 60.7 | 58.6 | 49.0 | 3.6 | 61.6 | 63.4 | 40.5 | 9.5 |
| Commercial fluorinated topcoat materials (for comparison) | | | | | | | | | | | | |
| TCX-014 | 77.8 | 86.6 | 55.6 | 30.4 | 39.2 | 41.0 | 24.0 | 6.9 | 24.0 | 49.0 | 28.1 | 8.2 |
| FGC-400 | 72.5 | 77.7 | 51.2 | 23.9 | 36.3 | 38.0 | 25.2 | 5.1 | 25.2 | 43.3 | 19.3 | 9.3 |
| TSP-3A | 119.3 | 112.6 | 110.8 | 1.3 | 61.7 | 60.0 | 56.0 | 1.2 | 56.0 | 63.5 | 59.3 | 1.4 |

FIG. 3

Contact Angles of Fluoropolymers

| Additive | Water | | | JSR HIL-001 | | | Bicyclohexyl | | |
|---|---|---|---|---|---|---|---|---|---|
| | $\theta_{adv.}$ | $\theta_{rec.}$ | $\theta_{tilt.}$ | $\theta_{adv.}$ | $\theta_{rec.}$ | $\theta_{tilt.}$ | $\theta_{adv.}$ | $\theta_{rec.}$ | $\theta_{tilt.}$ |
| None | 75.9 | 55.0 | 18.7 | - | 2.0 | 2.5 | 24.9 | 3.5 | 3.5 |
| CHiPrHFAMA | 93.9 | 80.8 | 10.7 | 26.8 | 14.2 | 4.7 | 35.5 | 23.0 | 5.1 |
| ECPMA/3FMA | 91.0 | 75.3 | 15.0 | 2.3 | <1 | <2 | - | - | - |
| Polymer 7 | 90.1 | 64.0 | 25.2 | 52.9 | 40.5 | 4.5 | 53.7 | 35.8 | 7.4 |
| Polymer 8 | 84.4 | 60.9 | 21.9 | 31.4 | 23.2 | 3.6 | 35.1 | 22.5 | 5.5 |
| Polymer 11 | 88.5 | 61.6 | 25.5 | 54.9 | 42.1 | 3.7 | 58.8 | 32.3 | 9.5 |
| Polymer 13 | 103.3 | 74.9 | 24.5 | 56.6 | 48.3 | 2.9 | 60.5 | 50.3 | 4.2 |

FIG. 4

Vase Analysis

| | Homogeneous (Average n&k) | Homogeneous (1682 n&k) | Dual Layer | Dual Layer w/ Gradient | Dual Layer w/ Intermixing |
|---|---|---|---|---|---|
| Top | - | - | - | - | - |
| Middle | - | - | 29.22 Å | 17.58 Å | 18.38 Å |
| Bottom | 1252.65 Å | 1243.8 Å | 1222.35 Å | 80.90 Å | 79.26 Å |
| | | | | 1231.14 Å | 1230.54 Å |
| Fitting Mean Square Error | 5.2725 | 4.6988 | 3.2869 | 3.159 | 3.1506 |

FIG. 5

PAG Extraction from Fluoropolymer

| Additive | Additive loading | PAG extraction | | |
|---|---|---|---|---|
| | | water | cyclooctane | bicyclohexyl |
| None (absolute values) | - | 28.5 ppb | 1.25 ppb | 0.62 ppb |
| None (normalized) | - | 100% | 100% | 100% |
| with 30nm TCX-014 topcoat | - | 5.8% | ND | ND |
| CHiPrHFAMA | 5 wt% | 13.8% | - | - |
| Polymer 4 | 5 wt% | 87.1% | - | - |
| Polymer 4 | 10 wt% | 87.9% | ND | - |
| Polymer 11 | 5 wt% | 156% | ND | ND |

FIG. 6

Refractive indices of Fluoropolymers

| Additive | $n_{193\,nm}$ | $k_{193\,nm}$ | $\alpha_{10}[\mu m^{-1}]$ |
|---|---|---|---|
| Polymer 1 | 1.501 | 0.0035 | 0.099 |
| Polymer 2 | 1.512 | 0.0004 | 0.011 |
| Polymer 3 | 1.511 | 0.0022 | 0.062 |
| Polymer 4 | 1.506 | 0.0056 | 0.157 |
| Polymer 5 | 1.504 | 0.0039 | 0.112 |
| Polymer 6 | 1.747 | 0.5138 | 8.643 |
| Polymer 7 | 1.644 | 0.2442 | 6.903 |
| Polymer 8 | 1.612 | 0.0709 | 2.005 |
| Polymer 9 | 1.569 | 0.3057 | 14.526 |
| Polymer 11 | 1.461 | 0.0002 | 0.006 |
| Polymer 12 | 1.454 | 0.0059 | 0.167 |
| Polymer 13 | 1.457 | 0.0022 | 0.061 |
| Comparative styrenic polymers | | | |
| Polystyrene | 1.741 | 1.1168 | 31.573 |
| Poly(4-hydroxystyrene) | 1.637 | 1.0171 | 28.756 |
| Poly(2,3,4,5,6-pentafluorostyrene) | 1.885 | 0.2506 | 7.0856 |

FIG. 8

PHOTORESIST COMPOSITIONS AND METHODS OF USE IN HIGH INDEX IMMERSION LITHOGRAPHY

BACKGROUND OF THE INVENTION

1. Field of the Invention

The present invention relates to the fields of chemistry, photolithography and semiconductor fabrication. More specifically, the invention is directed to a resist composition comprising a resist polymer and a fluoropolymer which increases the contact angle of the resist film with hydrocarbon-based high refractive index immersion fluids. The invention further relates to the resist compositions that can be used in immersion lithography without the use of an additional topcoat and a method of forming a photolithographic image, where a high refractive index immersion fluid such as decahydronaphthalene or tetrahydrodicyclopentadiene is interposed between the last lens fixture of an exposure tool and the photoresist-coated wafer.

2. Description of Related Art

The continuous drive to print smaller structures for advanced electronic device manufacturing requires the use of higher resolution optical lithography tools. Immersion lithography has extended 193 nm argon fluoride-based technology to 65 nm critical dimensions (half-pitch DRAM) and beyond by enabling lens designs with numerical apertures (NAs) greater than 1.0 and, thereby, increasing the resolution of optical scanners. Immersion lithography also offers increased depth of focus, resulting in larger process windows. Immersion lithography involves filling the gap between the last lens element of the exposure tool and the resist-coated substrate with an immersion fluid such as ultrapure water. See A. Hand, "Tricks with Water and Light: 193 nm Extension", Semiconductor International, Vol. 27, Issue 2, February 2004.

The practical numerical aperture limit of water-based immersion scanners is 1.35. In order to extend the capabilities of immersion lithography to larger NA, higher refractive index lens and immersion fluids are required. Since NA is given by $n_{medium} \sin \theta$ and $\sin \theta$ reaches a practical limit as it approaches a value of 1, the refractive indicies of the materials in the optical path effectively determine the numerical aperture. With water immersion, replacing air ($n_{air}=1$) with water ($n_{water}=1.435$) increased the maximum numerical apertures of imaging systems from 0.93 (dry) to 1.35 (water immersion). Replacement of water with an immersion fluid with a higher refractive index will continue this trend and enable even higher numerical aperture imaging systems.

Aqueous immersion fluids so far have shown limited refractive indices, high absorbance, and elevated viscosities (see Costner et al. *Proc. SPIE*, 2006, 6153, 61530B). Hydrocarbon-based immersion fluids such as decahydronaphthalene, bicyclohexyl, and tricyclo[$5.2.1^{1,7}.0^{2,6}$]decane (tetrahydrodicyclopentadiene) have emerged as the most promising high index immersion fluids. These bicyclic and polycyclic saturated alkanes have shown refractive indices up to 1.65 at 193 nm and transparencies that approach or even exceed water (see French et al. *Proc. SPIE*, 2006, 6154, 615415. Wang et al. *Proc. SPIE*. 2006, 6153, 61530A).

One of the technical challenges facing liquid immersion lithography is the diffusion between the photoresist components and the immersion medium. That is, during the immersion lithographic process, the photoresist components leach into the immersion medium and the immersion medium permeates into the photoresist film. Such diffusion is detrimental to photoresist imaging performance and might result in disastrous lens damage or contamination of the exposure tool. In addition, the surface energy of the photoresist must be engineered such that high contact angles with the immersion fluid are obtained. Meniscus forces are used to contain the immersion fluid beneath the immersion lens showerhead. At some wafer scan rate, the receding contact angle of the fluid falls to zero and a film of immersion fluid is left behind on the wafer. This phenomenon is referred to as film pulling. It has been shown that this residual fluid induces so-called watermark defects in the final printed features (see Wallraff et al. *Proc. SPIE*, 2006, 6153, 61531M, Kocsis et al. *Proc. SPIE*, 2006, 6154, 615409 and Stepanenko et al. *Proc. SPIE*, 2006, 6153, 615304). The higher the receding contact angle of the fluid on the surface, the faster the wafer scan be scanned. (see: Schuetter et al. *J. Microlith., Microfab., Microsys*. April-June 2006, 5, 023002).

One of the methods that has been quickly adopted by the resist community to resolve these issues is the application of protective topcoat materials on top of the photoresist layer for the purpose of eliminating diffusion of materials from the photoresist layer underneath and to control the surface energy and contact angle properties of the film stack (see Raub et al. *J. Vac. Sci. Technol. B*. 2004, 22, 3459-3464, Kocsis et al. *Proc. SPIE*, 2006, 6154, 615409 and Stepanenko et al. *Proc. SPIE*, 2006, 6153, 615304). As described above, protective topcoats are currently used in water immersion lithography. However, this adds additional process steps and material cost to conventional lithography. Alternatively, topcoat-free photoresists have been developed in which surface-active fluoropolymer additives segregate to the photoresist surface during film formation to control photoacid generator leaching and immersion fluid contact angles (see Sanders et al. *Proc. SPIE*, 2007, 6519, 651904 and Sanders et al. *Microlithography World*, 2007, 16(3) pages 8-13. These strategies have proven useful for water immersion lithography.

Water-based topcoat and additive materials are currently based on fluoropolymers with refractive indices around 1.45-1.55 at 193 nm. As mentioned previously, the numerical aperture of the imaging system will be limited by the lowest refractive index material in the imaging stack. The refractive index of the topcoat should be greater than the immersion fluid (in this case, greater than about 1.64). Current materials do not meet these requirements.

In addition, the chemical and physical properties of the high refractive index hydrocarbon fluids are quite different from water. It has been shown, for example, that the film pulling velocity of an immersion fluid will be proportional to its surface tension to viscosity ratio (see Schuetter et al. *J. Microlith., Microfab., Microsys*. April-June 2006, 5, 023002.). Since this ratio is roughly one-sixth that of water for the most promising high refractive index fluid candidates, film pulling has been observed at scan rates less than 100 mm/s (desired scan rates are 500 mm/s). As a result, it expected that the prevention of film pulling with high refractive index fluids will not be able to be prevented without dramatically reducing scan rates and tool throughput. Partially wet approaches are being explored in which small amounts of film pulling are allowed and the residual fluid is collected/removed after scanning. Other approaches in which the entire wafer is submerged in a pool or puddle of immersion fluid are also being considered. In all of these applications, the photoresist surface must have very low interaction with the hydrocarbon immersion fluid. As a result, there exists a need for improved materials with the appropriate optical properties which will allow for rapid scanning of wafers with controlled interaction with the hydrocarbon-based immersion fluids and reduced defectivity.

Bis-3,5-(hexafluoroisopropanol)cyclohexyl methacrylate and acrylate-based polymers have been developed for use as photoresists (see Hatakeyama et al. US 2005/0227173 and 2005/0227174) and topcoat materials for water-based immersion lithography (see Allen et al. US 2006/0188804 A1, Allen et al. US 2007/0254235 A1, Maeda et al. WO 2005/098541 A1, Hatakeyama et al. US 2006/0029884 A1, and Hata et al. US 2006/0275697A1). Additionally, α-trifluoromethyl (meth)acrylate polymers featuring bis-3,5-(hexafluoroisopropanol)cyclohexyl groups have been explored as photoresists (see Harada et al. US 2006/0177765 A1) and topcoats for water-based immersion lithography (see Ito et al. US 2006/0292484 A1 and US2006/0292485 A1, and Maeda et al. WO 2005/098541 A1). However, these materials have refractive indices too low to be of use in high index immersion lithography as topcoat materials. Bis-3,5-(hexafluoroisopropanol) cyclohexyl methacrylate polymers have been used as additives for topcoat-free resists in water immersion lithography with poor results (see Allen et al. 2007/0254235A1. These additives reduced photoacid generator (PAG) extraction into water by only ~15-20% (vide infra), which does not meet industry requirements. In addition, typical hexafluoroisopropanol-functionalized topcoat materials have shown poor contact angles with hydrocarbon-based high index fluids (vide infra).

As a result of these and other limitations, there is a need for materials to impart good resistance to hydrocarbon-based immersion fluids and high contact angles with hydrocarbon-based immersion fluids to photoresist materials in order to meet the requirements for high index immersion lithography.

SUMMARY OF THE INVENTION

The present invention relates to a composition comprising a mixture comprising a photoresist polymer and a fluoropolymer. In one embodiment, the fluoropolymer comprises a first monomer having a pendant group selected from alicyclic bis-hexafluoroisopropanol and aryl bis-hexafluoroisopropanol and a second monomer selected from fluorinated styrene and fluorinated vinyl ether. The invention composition has improved receding contact angles with high refractive index hydrocarbon fluids used in immersion lithography and, thereby, provides improved performance in immersion lithography. In another embodiment of the composition of the present invention, the photoresist polymer suitably comprises repeat units having a carboxylic acid group that is non protected, partially protected or fully protected with a photoacid cleavable group. Suitable cleavable groups include esters, carbonates, acetals and ketal groups. In another embodiment, the fluoropolymer comprises a monomer selected from acrylate and methacrylate. In a preferred embodiment, the fluoropolymer comprises a monomer selected from $C_{5-10}$ alicyclic bis-hexafluoroisopropanol methacrylate and $C_{5-10}$ alicyclic bis-hexafluoroisopropanol acrylate. In another embodiment, the fluoropolymer comprises a monomer having the pendant group $C_{6-10}$ aryl bis-hexafluoroisopropanol.

The present invention also relates to the process for forming a photoresist image on a substrate using the composition of the present invention. The composition of the present invention provides high receding contact angles when used in immersion lithography thus providing improved performance.

BRIEF DESCRIPTION OF THE DRAWINGS

The invention will now be described in greater detail with reference to the drawings, wherein:

FIG. 2 shows a comparison between the contact angles of the bis-fluoroalcohol-based polymer relative to other fluoroalcohol-containing polymers using water and organic high index fluids (JSR HIL-001 and bicyclohexyl).

FIG. 3 shows the contact angles of invention fluoroalcohol polymers using water and organic high index fluids (JSR HIL-001 and bicyclohexyl).

FIG. 4 shows 193 nm contrast curves of resist compositions with and without a fluoroalcohol polymer of the present invention.

FIG. 5 shows VASE analysis of the film structure of a composition of the present invention. Several different model profiles are fitted to the experimental data with the most accurate profile exhibiting the lowest fitting mean square error.

FIG. 6 shows the extraction of PAG from the composition of the present invention into fluids.

FIG. 8 shows the optical properties of fluoropolymers of the present invention.

DETAILED DESCRIPTION OF THE INVENTION

Figure 1A:
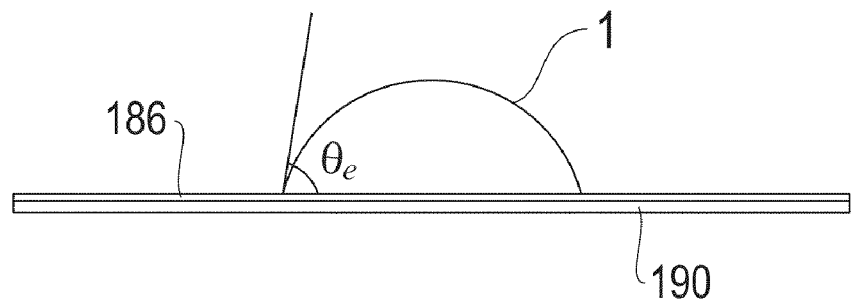
FIG. 1A shows the static contact angle ($\theta_e$) to be the angle when all participating phases (i.e., air, water and resist film) have reached their natural equilibrium positions and the three phase line is not moving.

Unless otherwise indicated, this invention is not limited to specific compositions, components, or process steps. It should also be noted that the singular forms "a" and "the" are intended to encompass plural referents, unless the context clearly dictates otherwise. The terminology used herein is for the purpose of describing particular embodiments only and is not intended to be limiting.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "alkyl" as used herein refers to a linear or branched, saturated hydrocarbon substituent that generally, although not necessarily, contains 1 to about 24 carbon atoms, such as methyl, ethyl, n-propyl, isopropyl, n-butyl, isobutyl, t-butyl, octyl, decyl, tetradecyl, hexadecyl, eicosyl, tetracosyl, and the like. Generally, although again not necessarily, alkyl groups herein contain 1 to about 12 carbon atoms, preferably, 1-6 carbons. The term "cycloalkyl" intends a cyclic alkyl group, typically having 3 to 12, preferably 3 to 8, carbon atoms. The term "substituted alkyl" refers to alkyl substituted with one or more substituent groups, i.e., wherein a hydrogen atom is replaced with a non-hydrogen substituent group, and the terms "heteroatom-containing alkyl" and "heteroalkyl" refer to alkyl substituents in which at least one carbon atom is replaced with a heteroatom such as O, N, or S. If not otherwise indicated, the terms "alkyl" includes linear, branched and cyclic alkyl and lower alkyl, respectively.

The term "alkylene" as used herein refers to a difunctional linear or branched saturated hydrocarbon linkage, typically although not necessarily containing 1 to about 24 carbon atoms, such as methylene, ethylene, n-propylene, n-butylene, n-hexylene, decylene, tetradecylene, hexadecylene, and the like. Preferred alkylene linkages contain 1 to about 12 carbon atoms, preferably 1 to 6 carbon atoms. The term "substituted alkylene" refers to an alkylene linkage substituted with one or more substituent groups, i.e., wherein a hydrogen atom is replaced with a non-hydrogen substituent group, and the terms "heteroatom-containing alkylene" and "heteroalkylene" refer to alkylene linkages in which at least one carbon atom is replaced with a heteroatom. If not otherwise indicated, the terms "alkylene" includes linear, branched and cyclic alkylene and lower alkylene, respectively.

The term "alkoxy" as used herein refers to a group —O-alkyl wherein "alkyl" is as defined above.

The term "alicyclic" is used to refer to cyclic, non-aromatic compounds, substituents and linkages, e.g., cycloalkanes and cycloalkenes, cycloalkyl and cycloalkenyl substituents linkages. Often, the term refers to polycyclic compounds, substituents, and linkages, including bridged bicyclic, compounds, substituents, and linkages. Preferred alicyclic moieties herein contain 3 to about 30, typically 5 to about 14, carbon atoms. It will be appreciated that the term "cyclic," as used herein, thus includes "alicyclic" moieties.

The term "heteroatom-containing" as in a "heteroatom-containing alkyl group" (also termed a "heteroalkyl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing. Examples of heteroalkyl groups include alkoxyalkyl, alkylsulfanyl-substituted alkyl, and the like.

Unless otherwise indicated, the term "hydrocarbyl" is to be interpreted as including substituted and/or heteroatom-containing hydrocarbyl moieties. "Hydrocarbyl" refers to univalent hydrocarbyl radicals containing 1 to about 30 carbon atoms, preferably 1 to about 18 carbon atoms, most preferably 1 to about 12 carbon atoms, including linear, branched, cyclic, alicyclic, and aromatic species.

By "substituted" as in "substituted alkyl," and the like, as alluded to in some of the aforementioned definitions, is meant that in the alkyl, or other moiety, at least one hydrogen atom bound to a carbon (or other) atom is replaced with a non-hydrogen substituent. Examples of suitable substituents herein include halo, hydrido (H—), sulfhydryl, $C_1$-$C_{12}$ alkoxy, acyl (including $C_2$-$C_{12}$ alkylcarbonyl (—CO-alkyl)), acyloxy (—O-acyl), $C_2$-$C_{12}$ alkoxycarbonyl (—(CO)—O-alkyl), hydroxycarbonyl (—COOH), carbamoyl (—(CO)—NH$_2$), substituted $C_1$-$C_{12}$ alkylcarbamoyl includes (—(CO)—NH($C_1$-$C_{12}$ alkyl)) and (—(CO)—N($C_1$-$C_{12}$ alkyl)$_2$), formyl (—(CO)—H), amino (—NH$_2$), mono- and di-($C_1$-$C_{12}$ alkyl)-substituted amino, mono- and $C_2$-$C_{12}$ alkylamido (—NH—(CO)-alkyl), imino (—CR=NH where R=hydrogen, $C_1$-$C_{12}$ alkyl. etc.), alkylimino (—CR=N (alkyl), where R=hydrogen, alkyl, etc.), $C_1$-$C_{20}$ alkylsulfanyl (—S-alkyl; also termed "alkylthio"), $C_5$-$C_{18}$ arylsulfanyl (—S-aryl; also termed "arylthio"), $C_1$-$C_{20}$ alkylsulfinyl (—(SO)-alkyl), $C_1$-$C_{20}$ alkylsulfonyl (SO$_2$-alkyl), hydroxysulfonyl (—SO$_2$—OH), phosphono (—P(O)(OH)$_2$), and the hydrocarbyl moieties $C_1$-$C_{24}$ alkyl (preferably $C_1$-$C_{12}$ alkyl). In addition, the aforementioned functional groups may, if a particular group permits, be further substituted with one or more additional functional groups or with one or more hydrocarbyl moieties such as those specifically enumerated above. Examples of linking groups include oxy (—O—), thio (—S—), carbonyloxy (—COO—), oxycarbonyl (—OCO—), sulfonyl (—SO$_2$—), carbonylthio (—COS—), carbonylamino (—CONR—) where R is hydrido or alkyl, alkylene, and phenylene (—$C_6H_4$—).

The term "fluorinated" refers to replacement of one or more hydrogen atoms in a molecule or molecular segment with one or more fluorine atoms, and includes perfluorinated moieties. The term "perfluorinated" is also used in its conventional sense to refer to a molecule or molecular segment wherein all hydrogen atoms are replaced with fluorine atoms. Thus, a "fluorinated" methyl group encompasses —CH$_2$F and —CHF$_2$ as well as the "perfluorinated" methyl group, i.e., —CF$_3$ (trifluoromethyl). The term "fluoroalkyl" refers to a fluorinated alkyl group, the term "fluoroalkylene" refers to a fluorinated alkylene linkage, the term "fluoroalicyclic" refers to a fluorinated alicyclic moiety, and the like.

A fluoroalcohol is defined as an organic compound bearing a hydroxyl group wherein one or more non-hydroxyl group hydrogen atoms are replaced with fluorine atoms. The fluoroalcohol may be comprised of a linear, branched, cyclic, polycyclic, or aromatic structure. Many non-limiting examples of such fluoroalcohols may be found in H. Ito "Chemical Amplification Resists for Microlithography," *Adv. Polym. Sci.* 2005, 172, 37-245.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The term "acid-labile" refers to a molecular segment containing at least one covalent bond that is cleaved upon exposure to acid. Typically, the reaction of acid-cleavable groups herein with photogenerated acid occurs only, or is promoted greatly by, the application of heat. Those skilled in the art will recognize the various factors that influence the rate and ultimate degree of cleavage of acid-cleavable groups as well as the issues surrounding integration of the cleavage step into a viable manufacturing process. The product of the cleavage reaction is generally an acidic group, which, when present in sufficient quantities, imparts solubility to the polymers of the invention in basic aqueous solutions.

Analogously, the term "acid-inert" refers to a substituent that is not cleaved or otherwise chemically modified upon contact with photogenerated acid.

The terms "photogenerated acid" and "photoacid" are used interchangeably herein to refer to the acid that is created upon exposure of the present photoresist compositions to radiation, by virtue of the photoacid generator contained in the compositions.

The term "substantially transparent" as used to describe a polymer that is "substantially transparent" to radiation of a particular wavelength refers to a polymer that has an absorbance of less than about 7.0/micron, preferably less than about 3.0/micron, most preferably less than about 1.5/micron, at a selected wavelength.

For additional information concerning terms used in the field of lithography and lithographic compositions, see Introduction to Microlithography, Eds. Thompson et al. (Washington, D.C.: American Chemical Society, 1994).

The present invention relates to a composition comprising a mixture comprising a photoresist polymer and a fluoropolymer. In one embodiment, the fluoropolymer is a polymer comprising a first monomer having a pendant group selected from alicyclic bis-hexafluoroisopropanol and aryl bis-hexafluoroisopropanol and preferably a second monomer selected from fluorostyrene and fluorinated vinyl ether. The two hexafluoroisopropanol substituents are attached to the alicyclic ring or aryl ring which is in turn attached to the polymer. The inventive composition comprising these components has improved receding contact angles with high refractive index hydrocarbon fluids used in immersion lithography and thereby provides improved performance in immersion lithography. In a preferred embodiment, the fluoropolymer comprises a monomer selected from $C_{5-10}$ alicyclic bis-hexafluoroisopropanol methacrylate and $C_{5-10}$ alicyclic bis-hexafluoroisopropanol acrylate.

In another embodiment of the present invention, the fluoropolymer comprises a monomer having a formula selected from:

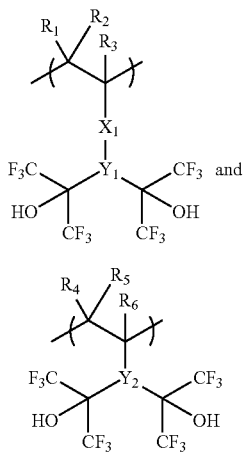

M1A

M1B

M1A wherein $R_1$, $R_2$, $R_4$, and $R_5$ are independently selected from hydrido and fluorine; $R_3$ and $R_6$ are independently selected from hydrido, fluorine, $C_1$-$C_4$ alkyl optionally fluorinated e.g., methyl and trifluoromethyl;

$X_1$ is a linking group independently selected from oxy, thio, carbonyloxy, oxycarbonyl, carbonylthio, sulfonyl, carbonylamino, alkylene, cycloalkylene optionally substituted with fluorine, alkyleneoxyalkylene, hetereoalkylene, phenylene, fluorinated phenylene, naphthylene or fluorinated naphthylene; and $Y_1$ and $Y_2$ are independently selected from $C_{1-10}$ alkylene and cycloalkylene and phenylene and naphthylene each optionally substituted with fluorine. Preferably, the polymer comprises a second monomer selected from a monomer having the formula:

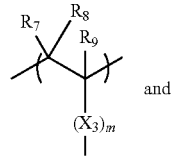

M2 and

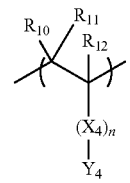

M3 wherein $R_7$, $R_8$, $R_{10}$, and $R_{11}$ are independently selected from hydrido and fluoro;

$R_9$ and $R_{12}$ are independently selected from hydrido, fluoro, $C_1$-$C_4$ alkyl optionally fluorinated e.g., methyl, and trifluoromethyl;

$X_3$ and $X_4$ are linking groups independently selected from oxy, thio, carbonyloxy, carbonyloxyalkylene, carbonylthio, sulfonyl, carbonylamino, alkylene and cycloalkylene each optionally substituted with fluorine, alkyleneoxyalkylene, hetereoalkylene, phenylene, fluorinated phenylene, naphthylene and fluorinated naphthylene; m and n are each independently selected from 0 and 1;

$Y_3$ is a substituent which includes at least one of the following groups: (i) an acid-labile group selected from alkoxycarbonyl, alkoxy, cycloalkoxy, alkyl, fluorinated alkyl, fluorinated alkoxy and fluorinated alkoxycarbonyl and/or (ii) an acidic functionality containing group selected from hydroxycarbonyl, hydroxysulfonyl, fluorinated hydroxyalkyl, hydroxyphenyl, hydroxynaphthyl, fluorinated sulfonamidyl, hydroxyamidyl, carbamoyl and alkylcarbamoyl; and $Y_4$ is selected from hydrido, fluoro, fluoroalcohol (hydroxyfluoroalkyl, e.g., bis-hexafluoroisopropanol), alkyl, fluorinated alkyl, fluorinated heteroalkyl, fluorinated phenyl and fluorinated naphthyl.

In one preferred embodiment, $X_1$ is selected from oxy, carbonyloxy, carbonylthio, fluorinated $C_{5-8}$ cycloalkylene and fluorinated phenylene. In another preferred embodiment, $Y_1$ and $Y_2$ are selected from $C_{5-8}$ cycloalkylene and phenylene each optionally substituted with fluorine.

In one embodiment M1A and M1B together comprise 20-100 mole % of the repeat units in the fluoropolymer, and in another embodiment, the sum of the mole % of the repeat units of M1A, M1B, M2, and M3 comprises at least about 80 mole % of the repeat units in the fluoropolymer.

The present invention further relates to a process for forming a photoresist image in a film positioned on the surface of a substrate comprising:
a) forming a film of the invention composition on the surface of a substrate;
b) patternwise exposing the film coated on the substrate to imaging irradiation;
c) optionally baking the exposed substrate;
d) contacting the coated substrate with a developer, suitably an aqueous alkaline developer, wherein a portion of the photoresist layer is removed from the substrate, thereby forming a patterned photoresist layer on the substrate.

Preferably, in the process of the invention, the film on the substrate is covered with a thin layer of fluid (e.g., water or a hydrocarbon fluid) prior to exposure to imaging radiation. Preferably, the fluid is a hydrocarbon fluid. It is to be understood that the hydrocarbon fluid need not be a single component fluid. It may comprise 1 or more hydrocarbon compounds (as long as at least 1 is a liquid at room temperature), surfactants, flow modifiers, stabilizers, and refractive index modifiers such as nanoparticles, ionic liquids, or coordination compounds.

In the process of the present invention, the fluoropolymer is mixed with the photoresist polymer. The mixture is then coated onto the surface of a substrate. When the mixture is coated as a resist film on a substrate, the fluoropolymer segregates to the surface of the film to form an enrichment layer over the entire film, which acts as an in-situ topcoat. The enrichment layer suitably will have a thickness of from about 1 to about 5 nm. The design scheme leads to high contact angles while maintaining good lithographic performance. In an alternative embodiment, the fluoropolymer comprising a pendant group of aryl hexafluoroisopropanol with or without a second monomer as defined above, can be used as a topcoat over a photoresist layer in immersion lithography suitably with UV radiation having a wavelength less than 200 nm.

It has been found that high receding contact angles are required to avoid film pulling behind the meniscus as the wafer travels underneath the immersion showerhead. Film pulling results in a trail of fluid film or droplets being left behind on the wafer. Subsequent evaporation of this residual fluid has been positively correlated with an increased number of defects (so-called watermarks) in the printed patterns. In addition, the heat of evaporation of the immersion fluid results in wafer cooling and may cause thermal shrinkage (which leads to overlay problems). The scan rate at which film pulling begins varies according to the immersion fluid, showerhead, and fluid management strategy employed by the immersion tool. Given the lower surface tension and higher viscosities of the hydrocarbon immersion fluids relative to water, film pulling is an issue at scan rates suitable for manufacturing. In this case, one of the roles of the fluoropolymer enrichment layer is to reduce the number of defects caused by this film of hydrocarbon fluid by providing a non-interacting surface.

In the process of the invention, a film of the invention composition is formed on a substrate, suitably a silicon substrate, by art known methods such as spin coating. The substrate can be uncoated or optionally coated with a layer of material such as anti-reflective coating, hardmask, transfer/planarization layer, low temperature oxide or the like. Optionally, after the film has been formed on the substrate, it can be baked at an elevated temperature of usually between 90 and 140° C. Suitably, the film on the substrate is then covered with a thin layer of immersion fluid suitably, a hydrocarbon fluid by art known methods. The film is then exposed patternwise to radiation, suitably shorter wavelength ultraviolet radiation (e.g., <200 nm such as 193 nm) or with extreme ultraviolet radiation or electron beam. After exposure to radiation, the hydrocarbon fluid may be removed and the film is then optionally baked at an elevated temperature. The substrate is then developed suitably by exposure to development fluid to form pattern in the film. The pattern can then be transferred to the underlying substrate by art known methods such as reactive ion etching.

The present invention is also directed to fluoropolymers including a polymeric or oligomeric compound having one of the following compositions:

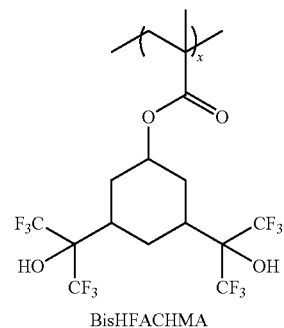

BisHFACHMA

Polymer 1: x=100 mole %

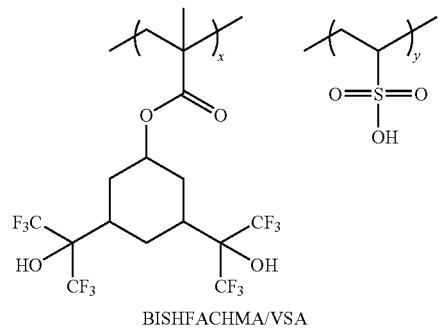

BISHFACHMA/VSA wherein x:y=99-90 mole %: 1-10 mole % and x+y>75 up to 100 mole %; as exemplified by:
Polymer 2: x=95 mole %, y=5 mole %;

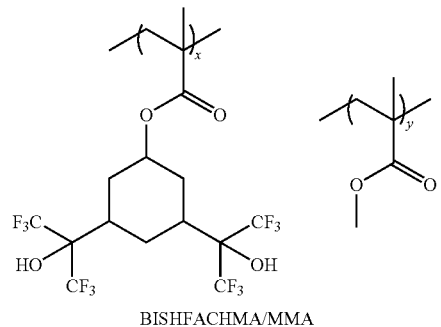

BISHFACHMA/MMA wherein x:y=99-40 mole %: 1-60 mole % and x+y does not exceed 100 mole %; as exemplified by:
Polymer 3: x=80 mole %, y=20 mole %;

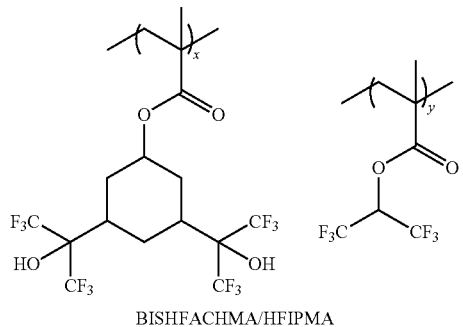

BISHFACHMA/HFIPMA wherein x:y=99-40 mole %: 1-60 mole % and x+y does not exceed 100 mole %; as exemplified by:

Polymer 4: x=70 mole %, y=30 mole %;

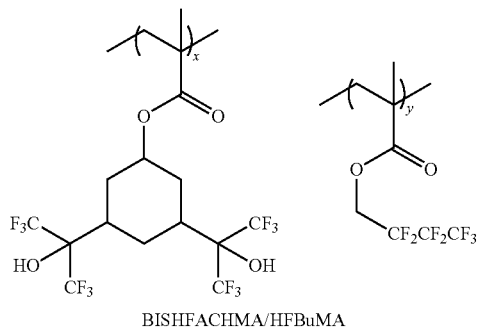

BISHFACHMA/HFBuMA wherein x:y=99-40 mole %: 1-60 mole % and x+y does not exceed 100 mole %; as exemplified by:
Polymer 5: x=70 mole %, y=30 mole %;

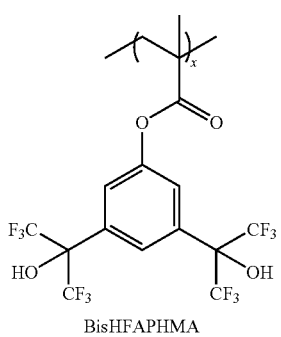

BisHFAPHMA

Polymer 6: x=100 mole %;

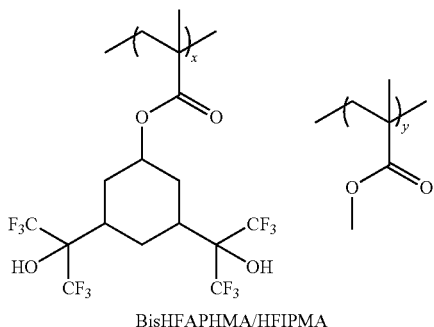

BisHFAPHMA/HFIPMA wherein x:y=99-40 mole %: 1-60 mole % and x+y does not exceed 100 mole %; as exemplified by:
Polymer 7: x=50 mole %, y=50 mole %;

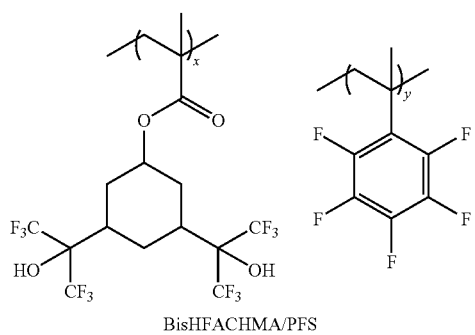

BisHFACHMA/PFS wherein x:y=99-40 mole %: 1-60 mole % and x+y does not exceed 100 mole %; as exemplified by:
Polymer 8: x=50 mole %, y 50 mole %;

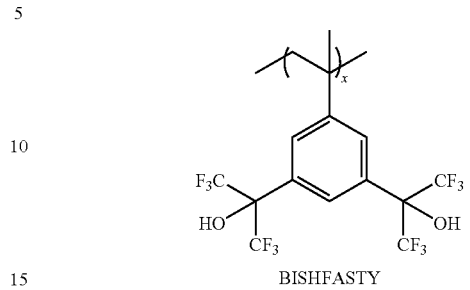

BISHFASTY

Polymer 9: x=100 mole %;

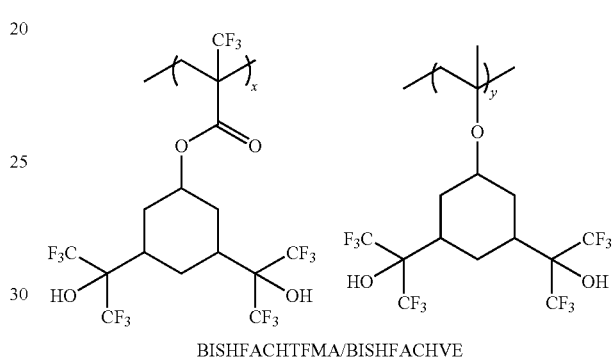

BISHFACHTFMA/BISHFACHVE wherein x:y=75-55 mole %: 25-45 mole % and x+y does not exceed 100 mole %; as exemplified by:
Polymer 10: x=66 mole %, y=33 mole %;

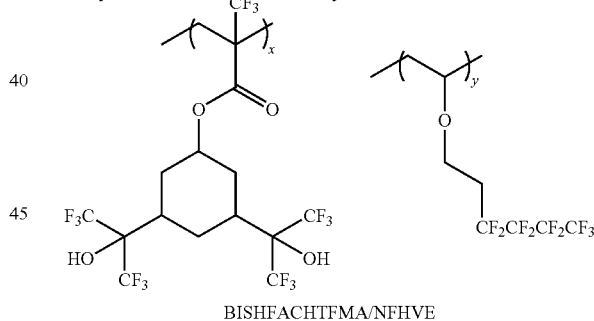

BISHFACHTFMA/NFHVE wherein x:y=75-55 mole %: 25-45 mole % and x+y does not exceed 100 mole %; as exemplified by:
Polymer 11: x=66 mole %, y=33 mole %;

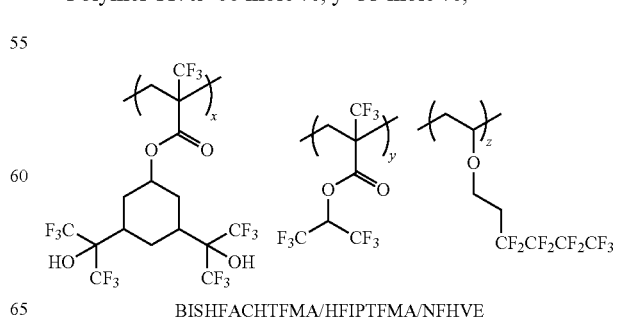

BISHFACHTFMA/HFIPTFMA/NFHVE wherein x:y:z=74-25 mole %: 1-45 mole %: 25-45 mole %; and x+y+z=does not exceed 100 mole %; as exemplified by:
Polymer 12: x=29 mole %, y=29 mole %; z=42 mole %;

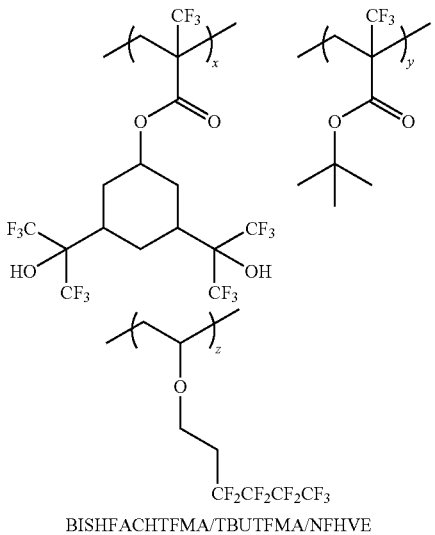

BISHFACHTFMA/TBUTFMA/NFHVE wherein x:y:z=75-20 mole %: 1-55 mole %: 25-45 mole % and x+y+z does not exceed 100 mole %; as exemplified by:
Polymer 13: x=36 mole %, y=27 mole %; z=37 mole %;

The fluoropolymer additive of this invention may be mixed with any desired photoresist polymer in the formulation of the invention resist composition. Photoresist polymers are polymers which experience a change in solubility in a development fluid after exposure to radiation such as UV, x-ray or electron beam radiation. Suitably, in the exposed portion of the photoresist polymer, the radiation causes a portion of a pendant group, such as a photoacid cleavable pendant ester group, to cleave to achieve increased solubility of the exposed portion of the polymer in the development fluid. Alternatively, the radiation can cause the exposed portion of the photoresist polymer to become less soluble in a development fluid. Preferably, the photoresist polymer is a chemical amplification photoresist that is imagable with shorter wavelength ultraviolet radiation (e.g., <200 nm wavelength) or with extreme ultraviolet radiation (EUV) or electron beam radiation. Examples of suitable chemically amplified resists are described in H. Ito, "Chemical Amplification Resists for Microlithography," *Advances in Polymer Science*, Vol. 172, pp. 37-245, 2005. The fluoropolymer of this invention may constitute about 0.01 percent by weight to about 20 percent by weight of the solid contents of the invention composition. Preferably, the fluoropolymer is less than about 5 percent by weight of the solid contents of the invention composition.

In the present invention, the photoresist polymer which includes oligomers can represent up to about 99 percent by weight of the solids included in the composition, and the photoacid generator can represent approximately 0.1 percent by weight to 25 percent by weight of the solids contained in the composition.

Suitable photoresist polymers include acrylates, methacrylates, cycloolefin polymers, cycloolefin maleic anhydride copolymers, cycloolefin vinyl ether copolymers, siloxanes, silsesquioxanes, carbosilanes. Other photoresist polymers which are oligomers include polyhedral oligomeric silsesquioxanes, carbohydrates, and other cage compounds. These polymers or oligomers are appropriately functionalized with aqueous base soluble groups, acid-labile groups, polar functionalities, silicon containing groups as needed.

The photoacid generator may be any compound that, upon exposure to radiation, generates a strong acid and is compatible with the other components of the photoresist composition. Examples of preferred photochemical acid generators (PAGs) include, but are not limited to, sulfonates, onium salts, aromatic diazonium salts, sulfonium salts, diaryliodonium salts and sulfonic acid esters of N-hydroxyamides or N-hydroxyimides, as disclosed in U.S. Pat. No. 4,731,605. Any PAG(s) incorporated into the present photoresists should have high thermal stability, i.e., be stable to at least 140° C., so they are not degraded during pre-exposure processing.

Any suitable photoacid generator can be used in the photoresist compositions of the invention. Typical photoacid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctanesulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl) diazomethane, and bis(cyclohexylsulfonyl) diazomethane;

(4) trifluoromethanesulfonate esters of imides and hydroxyimides, e.g., α-(trifluoromethylsulfonyloxy)-bicyclo[2.2.1] hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189,323; and miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

Other suitable photoacid generators are disclosed in Reichmanis et al. *Chemistry of Materials,* 1991, 3, 395 and in U.S. Pat. No. 5,679,495 to Yamachika et al. Additional suitable acid generators useful in conjunction with the compositions and methods provided herein will be known to those skilled in the art and/or are described in the pertinent literature.

The remainder of the invention composition is suitably composed of a solvent and may additionally, if necessary or desirable, include customary additives such as, but not limited to, dissolutions inhibitors, dyes, sensitizers, additives used as stabilizers, dissolution modifying additives, and acid-diffusion controlling agents, bases/quenchers, coating aids such as surfactants or anti-foaming agents, crosslinking agents, photospeed control agents, adhesion promoters and plasticizers.

In addition to the above components, the photoresist compositions provided herein generally include a casting solvent to dissolve the other components so that the overall composition may be applied evenly on the substrate surface to provide a defect-free coating. The choice of solvent is governed by many factors not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., *Introduction to Microlithography*, Eds. Thompson et al., cited previously. Where the photoresist composition is used in a multilayer imaging process, the solvent used in the imaging layer photoresist is preferably not a solvent to the underlayer materials, otherwise the unwanted intermixing may occur. The invention is not limited to selection of any particular solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol. Preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Those skilled in the art will recognize that any number of solvents or solvent mixtures may be used.

Greater than 50 percent of the total mass of the resist composition is typically composed of the solvent, preferably greater than 80 percent.

Other customary additives include dyes that may be used to adjust the optical density of the formulated resist and sensitizers which enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

In addition to the above, a wide variety of art known compounds with varying basicity may be used as stabilizers in the invention composition. Art known surfactants may be used to improve coating uniformity, and a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting. One skilled in the art will recognize the wide spectrum of commercially available products that may be used to carry out the types of functions that these customary additives perform.

Typically, the sum of all customary additives will comprise less than 20 percent of the solids included in the resist formulation, preferably, less than about 5 percent.

The present invention, as mentioned above, is directed to an inventive composition which has a low surface energy, i.e., high contact angle. The structures presented above have been characterized for static, advancing, and receding contact angles.

EXAMPLES

The following examples are intended to provide those of ordinary skill in the art with a complete disclosure and description of how to prepare and use the compositions disclosed and claimed herein. Efforts have been made to ensure accuracy with respect to measured numbers, but allowance should be made for the possibility of errors and deviations. Unless indicated otherwise, parts are parts by weight, temperature is in ° C. and pressure is at or near atmospheric. 3,5-bis(1,1,1,3,3,3-hexafluoropropan-2-ol-2-yl)cyclohex-1-yl methacrylate, 3,5-bis(1,1,1,3,3,3-hexafluoropropan-2-ol-2-yl)cyclohex-1-yl trifluoromethacrylate, 3,5-bis(1,1,1,3,3,3-hexafluoropropan-2-ol-2-yl)phenyl methacrylate, t-butyl trifluoromethacrylate, 1,1,1,3,3,3-hexafluoroisoprop-2-yl methacrylate, 1,1,1,3,3,3-hexafluoroisoprop-2-yl trifluoromethacrylate, and 1,1,1,2,2,3,3,4,4-nonafluorohex-6-yl vinyl ether, were obtained from Central Glass (Japan). Additionally, all the other starting materials were obtained commercially or were synthesized using known procedures.

Where appropriate, the following techniques and equipment were utilized in the examples: $^1$H and $^{13}$C NMR spectra were obtained at room temperature on an Avance 400 spectrometer. Quantitative $^{13}$C NMR was run at room temperature in acetone-d6 in an inverse-gated $^1$H-decoupled mode using Cr(acac)$_3$ as a relaxation agent on an Avance 400 spectrometer. For polymer composition analysis $^{19}$F NMR (379 MHz) spectra were also obtained using a Bruker Avance 400 spectrometer. Thermo-gravimetric analysis (TGA) was performed at a heating rate of 5° C./min in N$_2$ on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Optical density or absorbance measurements at 193 nm were performed using a Varian Cary Model 400 spectrometer on multiple thicknesses on quarts wafers. Film thickness was measured on a Tencor alpha-step 2000 or Nanospec. A quartz crystal microbalance (QCM) with a MAXTEC Inc. PLO-10 Phase lock oscillator was used to study the dissolution kinetics of the resist films in an aqueous 0.26N tetramethylammonium hydroxide (TMAH) solution (CD-26). Lithographic evaluation was performed on a 0.6 NA 193 nm ISI ministepper dry exposure tool or a 193 nm interferometric immersion exposure tool.

Contact angles were measured on an OCA video based contact angle system from FDS Future Digital Scientific Corporation, using the sessile drop method. The advancing and receding contact angles were measured using a tilting stage.

Figure 1B:
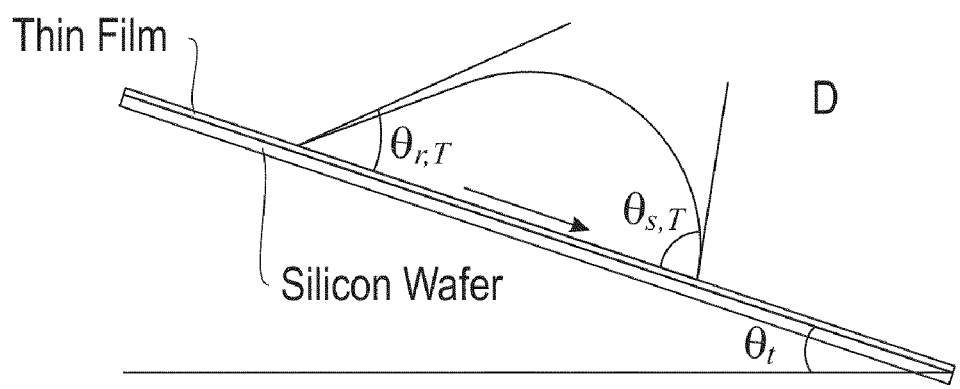
FIG. 1B shows how static advancing ($\theta_s$ T) and receding ($\theta_r$ T) contact angles are measured with the tilting stage setup.

Referring to FIG. 1, in the present invention we present the static contact angle ($\theta_{static}$ or $\theta_e$), advancing contact angle ($\theta_{adv}$ or $\theta_s$ T), receding contact angle ($\theta_{rec}$ or $\theta_r$ T), and tilt angle ($\theta_{tilt}$). FIG. 1A shows the static contact angle to be the angle when all participating phases (i.e. air, water and resist film) have reached their natural equilibrium positions and the three phase line is not moving. Reported are static contact angles with a calculated average from 5-10 measurements of a 5 μL ionized water drop. FIG. 1B shows how advancing ($\theta_{adv}$) and receding ($\theta_{rec}$) static contact angles are measured with the tilting stage setup. A 50 μL drop is placed on the substrate, the substrate is thereafter tilted until the droplet starts moving. The tilt angle ($\theta_{tilt}$), $\theta_{adv}$ and $\theta_{rec}$ are measured just before the drop starts moving. The presented numbers are calculated from and average of 3-5 separate measurements.

One of the main objectives of using a topcoat is to prevent leaching of extractables from the resist into the immersion liquid. Extraction of resist components into water was performed using WEXA (Water Extraction Apparatus, see R. D. Allen et. al., *J. Photopolym. Sci. & Technol.*, 2005, 18 (5), 615-619). Selected materials in the present invention were set in contact with immersion fluid in a controlled reproducible manner (time, speed, volume, contact area etc.). In the case of water, the fluid was thereafter collected and directly analyzed for extractables by MPI Research (State College, Pa.) using LC/MS/MS. For hydrocarbon fluids, the collected fluid was evaporated by blowing a stream of ultrapure argon over the fluid at a temperature between 20 and 60° C. until dryness. Then the sample was redissolved in 5 grams of deionized ultrapure water. The resulting aqueous sample was then directly analyzed for extractables by MPI Research using LC/MS/MS. Reported are the amount sulfonate extractables originating from the PAG (photo acid generator) that is a component of the resist. For ease of understanding, the amount is reported as percent extractable reduction using an additive covered by the present invention as compared to without using an additive.

Polymers 1-9 were generally synthesized by the following procedure (using Polymer 6 as an example) starting with appropriate monomers in the required quantities. Isolation conditions vary depending upon the solubility of the resulting polymers. Normally, multiple precipitations into hexane or methanol were used when possible. Otherwise, an alternative isolation techniques such as that described was used.

3,5-Bis(1,1,1,3,3,3-hexafluoroisopropan-2-ol-2-yl)phenyl methacrylate (3.0 grams, 6.07 mmol), and 8 mL of tetrahydrofuran (THF) were placed in a round bottom flask equipped with a condenser and a nitrogen inlet. 2,2'-Azobisisobutyronitrile (AIBN) (0.0399 grams, 0.243 mmol) was added to this solution and stirred until dissolved. The solution was then degassed using three vacuum/nitrogen purges. The contents were then heated to reflux for 12 hours. Afterwards, hexanes were added to the solution and the solvent was then removed in vacuo until a thick viscous syrup was obtained. The resulting viscous syrup was added to hexanes and stirred vigorously for several hours. The hexane was decanted and fresh hexane added. This process was repeated several times after which the polymer flakes/powder stirred freely in the suspension and were non-tacky. The polymer was collected by filtering through a fritted glass filter, after which it was dried under vacuum at 80° C. overnight to afford 2.13 g (71% isolated yield) as a white powder.

Polymer 1: Synthesis of poly(3,5-bis(1,1,1,3,3,3-hexafluoroisopropan-2-ol-2-yl)cyclohexyl methacrylate) (BISHFACHMA):

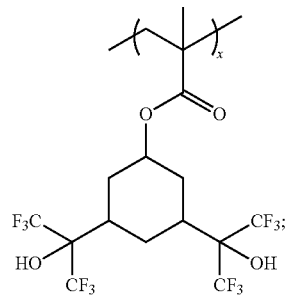

x = 100 mole %

$M_n$=162,480. PDI=3.29. Tg: 179° C. n(193 nm)=1.501. $\alpha_{10}$(193 nm)=0.099 μm$^{-1}$ Dissolution rate=1066 nm/s.

Polymer 2: Synthesis of poly(3,5-bis(1,1,1,3,3,3-hexafluoroisopropan-2-ol-2-yl)cyclohexyl methacrylate-co-vinyl sulfonic acid) (BISHFACHMA/VSA):

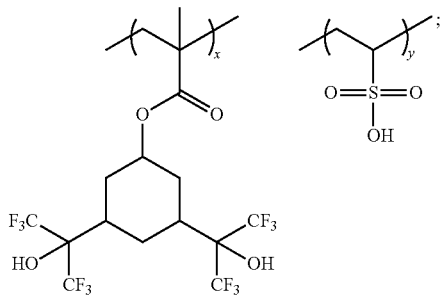

x = 95 mole %, y = 5 mole %

$M_n$=5773. PDI=1.28. Tg: 139° C. n(193 nm)=1.512. $\alpha_{10}$ (193 nm)=0.011 μm$^{-1}$.

Polymer 3: Synthesis of poly(3,5-bis(1,1,1,3,3,3-hexafluoroisopropan-2-ol-2-yl)cyclohexyl methacrylate-co-methyl methacrylate) (BISHFACHMA/MMA):

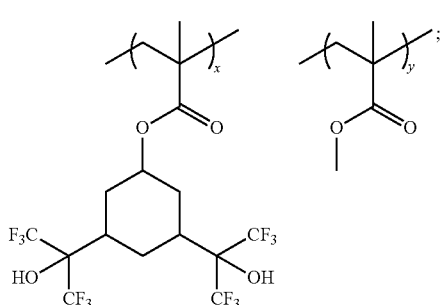

x = 80 mole %, y = 20 mole %

$M_n$=26157. PDI=2.16. n(193 nm)=1.511. $\alpha_{10}$(193 nm)=0.062 μm$^{-1}$.

Polymer 4: Synthesis of poly(3,5-bis(1,1,1,3,3,3-hexafluoroisopropan-2-ol-2-yl)cyclohexyl methacrylate-co-1,1,1,3,3,3-hexafluoroisoprop-2-yl methacrylate) (BISHFACHMA/HFIPMA):

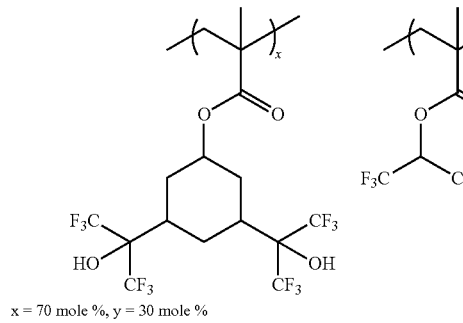

x = 70 mole %, y = 30 mole %

$M_n$=5134. PDI=1.51. Tg: 100° C. n(193 nm)=1.506. $\alpha_{10}$(193 nm)=0.157 $\mu m^{-1}$. Dissolution rate=540 nm/s.

Polymer 5: Synthesis of poly(3,5-bis(1,1,1,3,3,3-hexafluoroisopropan-2-ol-2-yl)cyclohexyl methacrylate-co-1,1,1,2,2,3,3-heptafluorobut-4-yl methacrylate) (BISHFACHMA/HFBuMA):

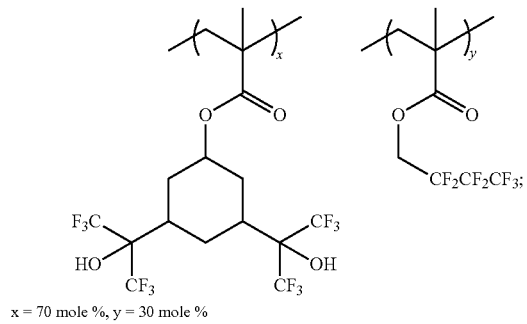

x = 70 mole %, y = 30 mole %

$M_n$=5587. PDI=1.60. Tg: 113° C. n(193 nm)=1.504. $\alpha_{10}$(193 nm)=0.112 $\mu m^{-1}$. Dissolution rate=65 nm/s.

Polymer 6: Synthesis of poly(3,5-bis(1,1,1,3,3,3-hexafluoroisopropan-2-ol-2-yl)phenyl methacrylate) (BISHFAPHMA):

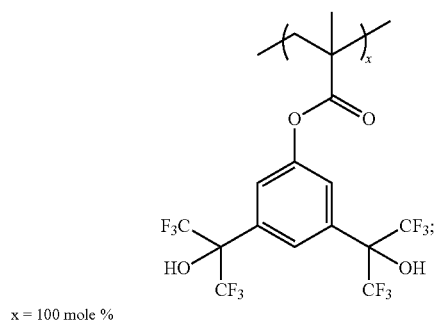

x = 100 mole %

$M_n$=8525. PDI=1.79. Tg: 132.7° C. n(193 nm) 1.747. $\alpha_{10}$ (193 nm)=8.643 $\mu m^{-1}$. Dissolution rate=3050 nm/s.

Polymer 7: Synthesis of poly(3,5-bis(1,1,1,3,3,3-hexafluoroisopropan-2-ol-2-yl)phenyl methacrylate-co-1,1,1,3,3,3-hexafluoroisoprop-2-yl methacrylate) (BISHFAPHMA/HFIPMA):

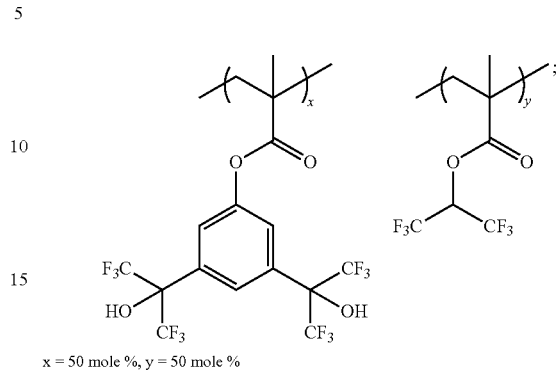

x = 50 mole %, y = 50 mole %

$M_n$=10552. PDI=1.74. Tg: 122.6° C. n(193 nm)=1.644. $\alpha_{10}$ (193 nm)=6.903 $\mu m^{-1}$.

Polymer 8: Synthesis of poly(3,5-bis(1,1,1,3,3,3-hexafluoroisopropan-2-ol-2-yl)cyclohexyl methacrylate-co-2,3,4,5,6-pentafluorostyrene) (BISHFACHMA/PFS):

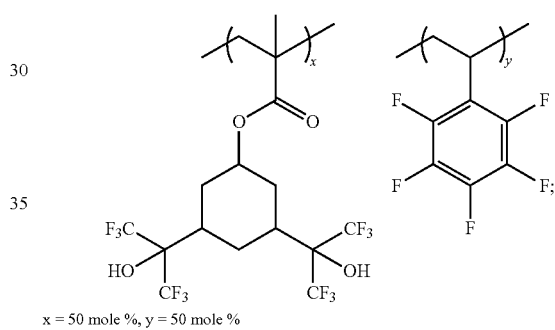

x = 50 mole %, y = 50 mole %

$M_n$=14058. PDI=1.70. Tg: 147.6° C. n(193 nm)=1.612. $\alpha_{10}$ (193 nm)=2.005 $\mu m^-$.

Polymer 9: Synthesis of poly(3,5-bis(1,1,1,3,3,3-hexafluoroisopropan-2-ol-2-yl)styrene (BISHFASTY)

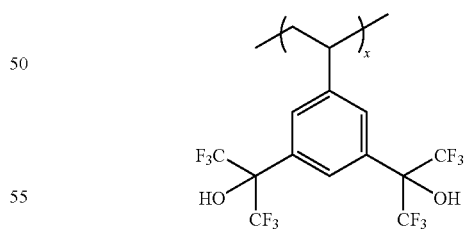

Tg: none observable up to 200° C. n(193 nm)=1.569. $\alpha_{10}$(193 nm)=14.526 $\mu m^-$. Dissolution rate=8260 nm/s.

Polymers 10-13 were synthesized according to the general procedures reported by Ito and Sundberg in US2006/0292484 A1 which is incorporated herein by reference.

Polymer 10: Synthesis of poly(3,5-bis(1,1,1,3,3,3-hexafluoroisopropan-2-ol-2-yl) trifluoromethacrylate-co-3,5-bis(1,1,1,3,3,3-hexafluoroisopropan-2-ol-2-yl)cyclohexyl vinyl ether) (BISHFACHTFMA/BISHFACHVE):

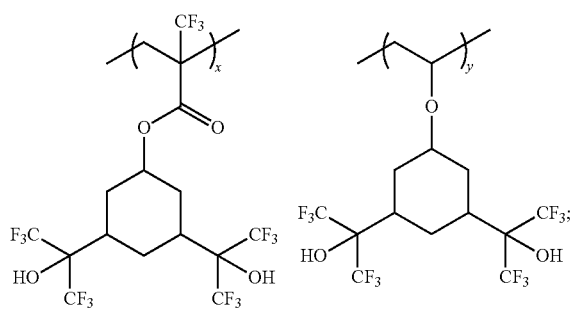

x = 66 mole %, y = 33 mole %

$M_n$=35,000. PDI=1.89. Tg: 164° C.

Polymer 11: Synthesis of poly(3,5-bis(1,1,1,3,3,3-hexafluoroisopropan-2-2-yl)cyclohexyl trifluoromethacrylate-co-1,1,1,2,2,3,3,4,4-nonafluorohex-6-yl vinyl ether) (BISHFACHMA/NFHVE):

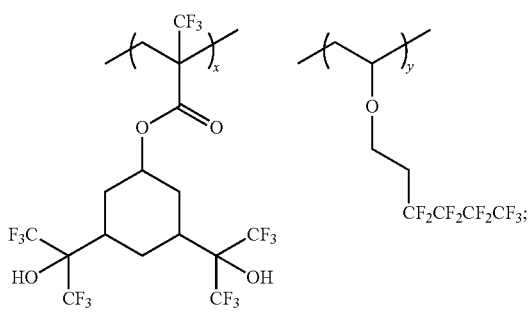

x = 66 mole %, y = 33 mole %

Tg: 104.4° C. n(193 nm)=1.461. $\alpha_{10}$(193 nm)=0.006 $\mu m^{-1}$.

Polymer 12: Synthesis of poly(3,5-bis(1,1,1,3,3,3-hexafluoroisopropan-2-ol-2-yl)cyclohexyl methacrylate-co-1,1,1,3,3,3-hexafluoroisoprop-2-yl trifluoromethacrylate-co-1,1,1,2,2,3,3,4,4-nonafluorohex-6-yl vinyl ether) (BISFACHTFMA/HFIPTFMA/NFHVE)

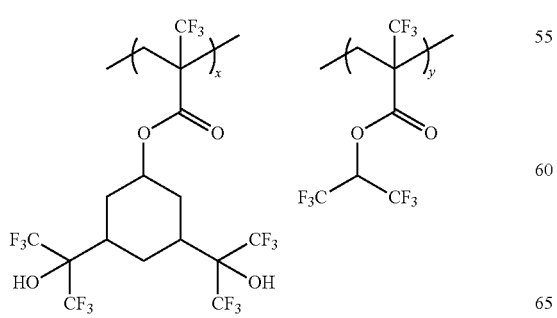

-continued

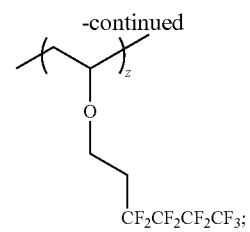

x = 29 mole %,
y = 29 mole %;
z = 42 mole %

$M_n$=66269. PDI=2.71. Tg: 80° C. n(193 nm)=1.454. $\alpha_{10}$(193 nm)=0.167 $\mu m^{-1}$.

Polymer 13: Synthesis of poly(3,5-bis(1,1,1,3,3,3-hexafluoroisopropan-2-ol-2-yl)cyclohexyl methacrylate-co-t-butyl trifluoromethacrylate-co-1,1,1,2,2,3,3,4,4-nonafluorohex-6-yl vinyl ether) (BISHFACHTFMA/TBUTFMA/NFHVE)

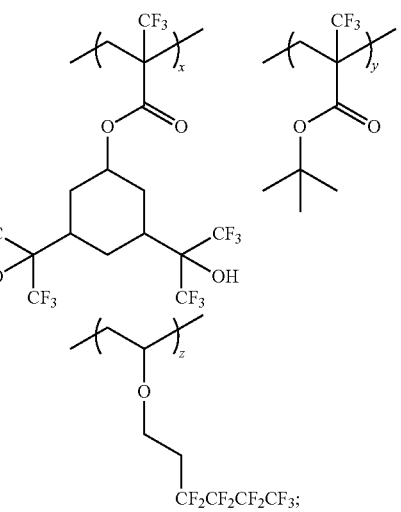

x = 36 mole %,
y = 27 mole %;
z = 37 mole %

$M_n$=29950. PDI=2.13. Tg: 82-84° C. n(193 nm)=1.457. $\alpha_{10}$(193 nm)=0.061 $\mu m^{-1}$.

The contact angles of a variety of fluoroalcohol-functionalized methacrylate polymers are shown in FIG. 2. The structures are shown below:

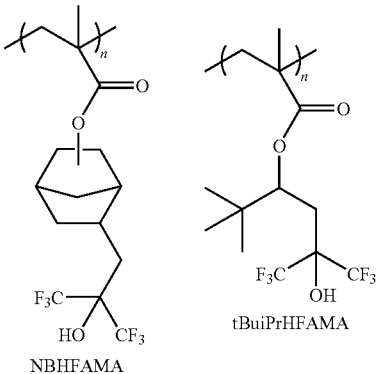

NBHFAMA  tBuiPrHFAMA

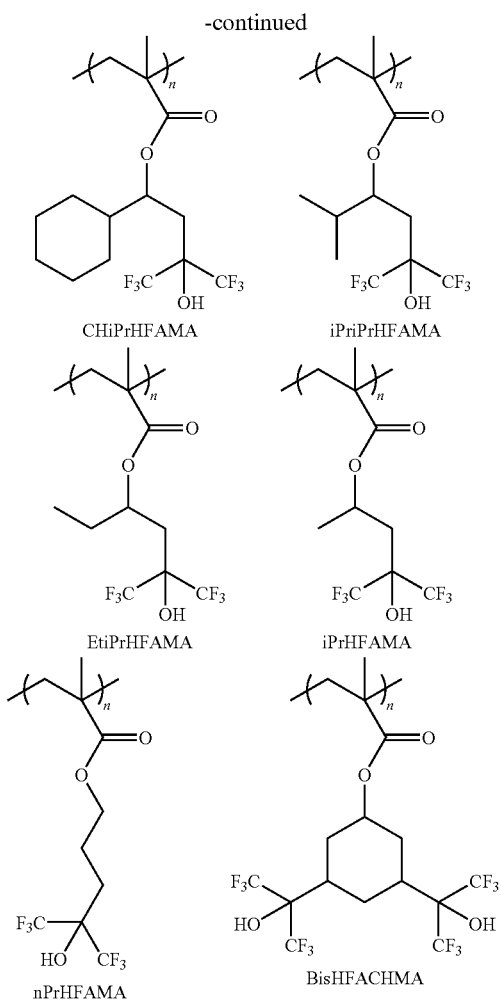

Finally, the incorporation of latent acidic groups affords the highest hydrophobicity, surface activity, and fluid contact angles. These latent acidic groups (like the t-butyl ester in Polymer 13) are deprotected in the exposed regions to form carboxylic acid groups which can react with developer to confer aqueous base solubility. The photospeed of the additive with latent acidic groups may be adjusted by using protecting groups with lower activation energies (such as 1-ethyl cyclopentyl or tetrahydropyranyl or t-butoxy carbonyl). It is preferable to have the photospeed of the additive be faster (or at least equal) to that of the photoresist.

Comparison with a base-soluble conventional topcoat material (JSR TCX-014) and a base-soluble fluoroalcohol-based polymer (Asahi Glass FGC-400) reveals that the bis(hexafluoroisopropanol)-based polymers offer superior contact angles with both JSR HIL-001 and bicyclohexyl. In fact, the performance reaches levels that heretofore have only been achieved by highly fluorinated topcoat polymers like TOK TSP-3A that are insoluble in conventional aqueous base developer and require exotic stripping solvents.

Several polymers from FIG. 3 were added to JSR 1682J (5 wt % relative to solids content of the resist formulation) and the contact angles reported in FIG. 4. Conventional 193 nm photoresists (typified but JSR AR1682J) show moderate water contact angles and extremely low contact angles with hydrocarbon fluids (<5 degrees). Without any surface modification, hydrocarbon immersion fluids will exhibit film pulling at extremely low scan rates (<50 mm/s) on these surfaces. While additives such as CHiPrHFAMA or ECPMA/3FMA (poly(1-ethyl cyclopentyl methacrylate-co-2,2,2-trifluoroethyl methacrylate) (70:30)), which were designed for use with water, show extremely high receding water contact angles, they offer only poor/moderate receding contact angles with JSR HIL-001 or bicyclohexyl. In marked contrast, the bis(hexafluoroisopropanol)-based additives (Polymers 7, 8, 11, and 13) exhibit slightly lower receding water contact angles, but much increased receding contact angles with hydrocarbon fluids.

Variable angle scanning ellipsometry (VASE) was used to model the profile of surface enrichment layer in the blend of JSR AR1682J and Polymer 11 (5 weight % relative to resist solids content). Referring to FIG. 5, several potential fitting models were used to analyze the results and the model with the lowest mean square error was a dual layer with an intermixing layer. This indicates the photoresist film contains a surface fluoropolymer layer that is approximately 2 nm thick with an 8 nm intermixing zone.

Figure 7:
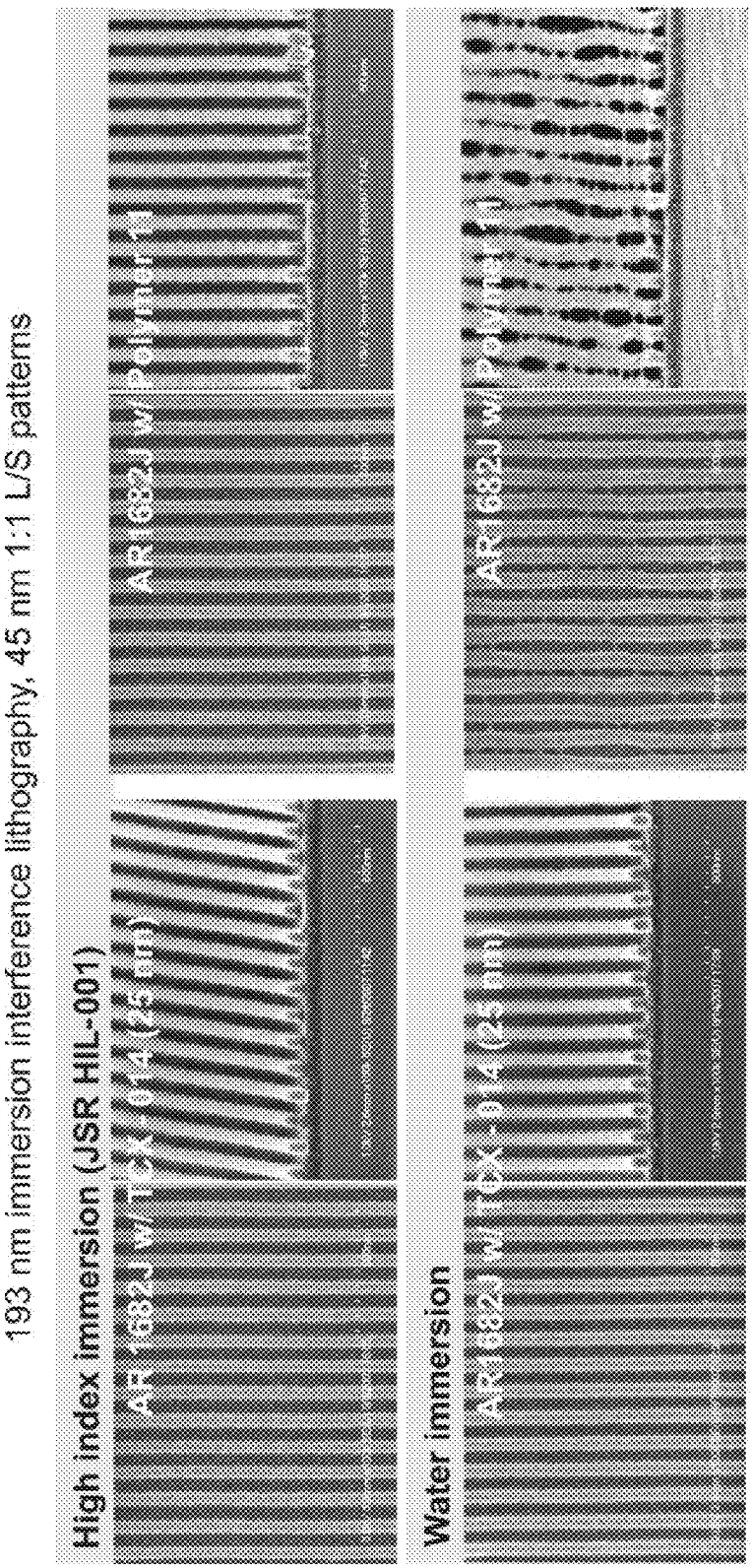
FIG. 7 shows comparative immersion interference lithographic imaging results of the composition of the present invention using JSR HIL-001 high index immersion fluid and water.

While clear surface enrichment of the bis(hexafluoroisopropanol)-based additives is observed by contact angle and ellipsometry, these types of additives do not effectively prevent photoacid generator (PAG) leaching in water immersion lithography as shown in FIG. 6. The high levels of PAG leaching into water found for resists blends with 3,5-bis(hexafluoroisopropanol)cyclohexyl-based acrylic polymer additives is often evidenced by scumming and t-topping of the resist profiles when the compositions are imaged using water-based immersion lithography. As a result, these additives are not useful for water immersion lithography; however, the much lower solubility and extraction rates of common ionic PAGs in hydrocarbon-based high index immersion fluids will allow these additives to function adequately in high index immersion lithography. This is demonstrated by the difference in imaging performance using water and high index immersion fluids shown in FIG. 7 due to the negligible PAG extraction into hydrocarbon immersion fluids observed when polymer 11 is used as an additive (shown in FIG. 6).

The influence of structure on the water contact angles of fluoroalcohol-based methacrylates has been reported (Sanders et al. *Proc. SPIE*, 2007, 6159, 615904). However, it can be seen in FIG. 2, the preferred fluoroalcohol structures for increased contact angles with hydrocarbons are significantly different than those preferred for water-based applications. The 3,5-bis(hexafluoroisopropanol)cyclohexyl methacrylate structure is unique due to its high receding contact angles with the hydrocarbon fluids and acceptable glass transition temperature.

The bis(hexafluoroisopropanol)cyclohexyl methacrylate structure was used as the basis for a number of additive polymers incorporating various other hydrophilic, hydrophobic, and latent acidic comonomers. The contact angles of these 3,5-bis(hexafluoroisopropanol)cyclohexyl methacrylate-based additive polymers were measured as described infra using water, JSR HIL-001 (a commercial high index immersion fluid), and bicyclohexyl. The results are shown in FIG. 3.

Fluorinated comonomers such as HFIPMA and F7BuMA can be used to increase hydrophobicity, surface activity, and fluid contact angles (see polymers 4 and 5); however, at high comonomer loadings, the additives become insoluble in developer. Another method to boost hydrophobicity, surface activity, and fluid contact angles is to decrease hydrocarbon groups and increase fluorocarbon content by using a trifluoromethacrylate-vinyl ether backbone (Polymers 10-13).

The refractive indices of the polymers as determined by VASE are given in FIG. 8. In applications where the thin enrichment layer of a low refractive index polymer may prohibit good lithography due to poor surface reflectivity, the refractive index may be boosted by incorporating fluorinated aromatic monomers (e.g. pentafluorostyrene in Polymer 8 or 3,5-bis(hexafluoroisopropanol)phenyl methacrylate in Polymers 6 and 7). These fluorinated styrenic compounds feature high refractive indices (n) at 193 nm while having unusually low absorbance at 193 nm relative to their non-fluorinated counterparts like polystyrene and poly(4-hydroxystyrene) as shown in FIG. 8. These results of adding the fluorinated aromatic monomers are refractive indices that approach or match that of current high index immersion fluids (n~1.64-1.65 at 193 nm).

Figure 9:
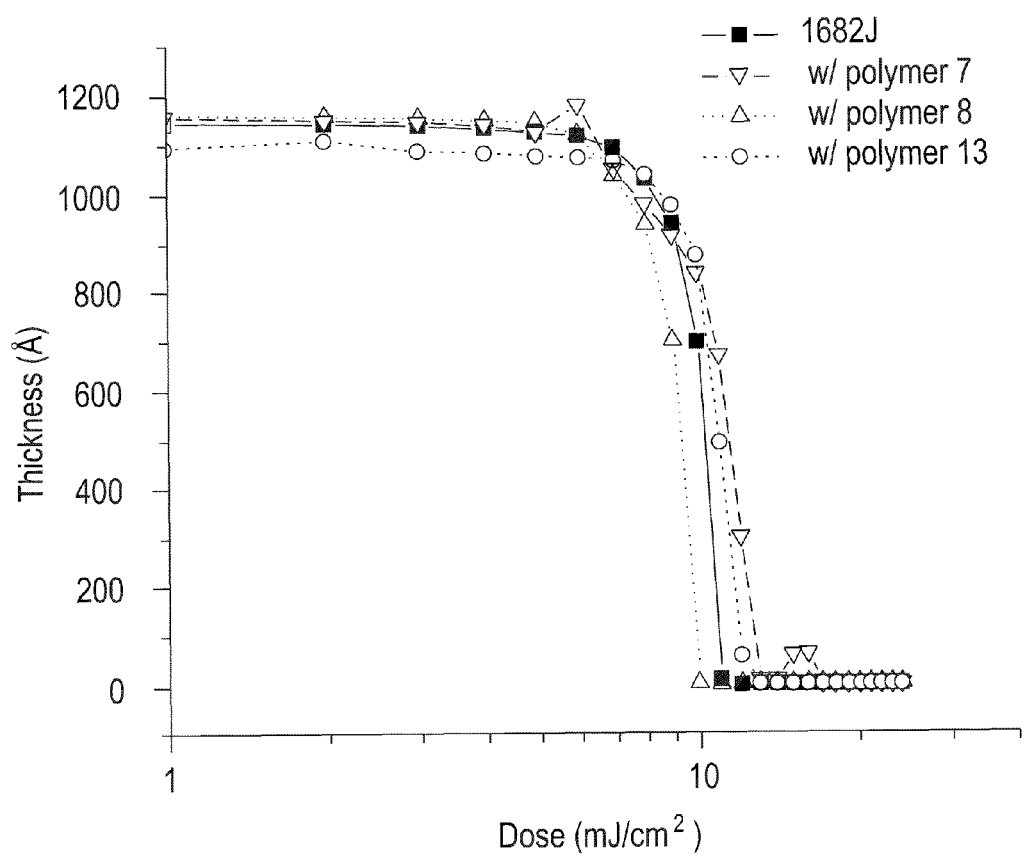
FIG. 9 shows contrast curves of compositions of the present invention.
Figure 10:
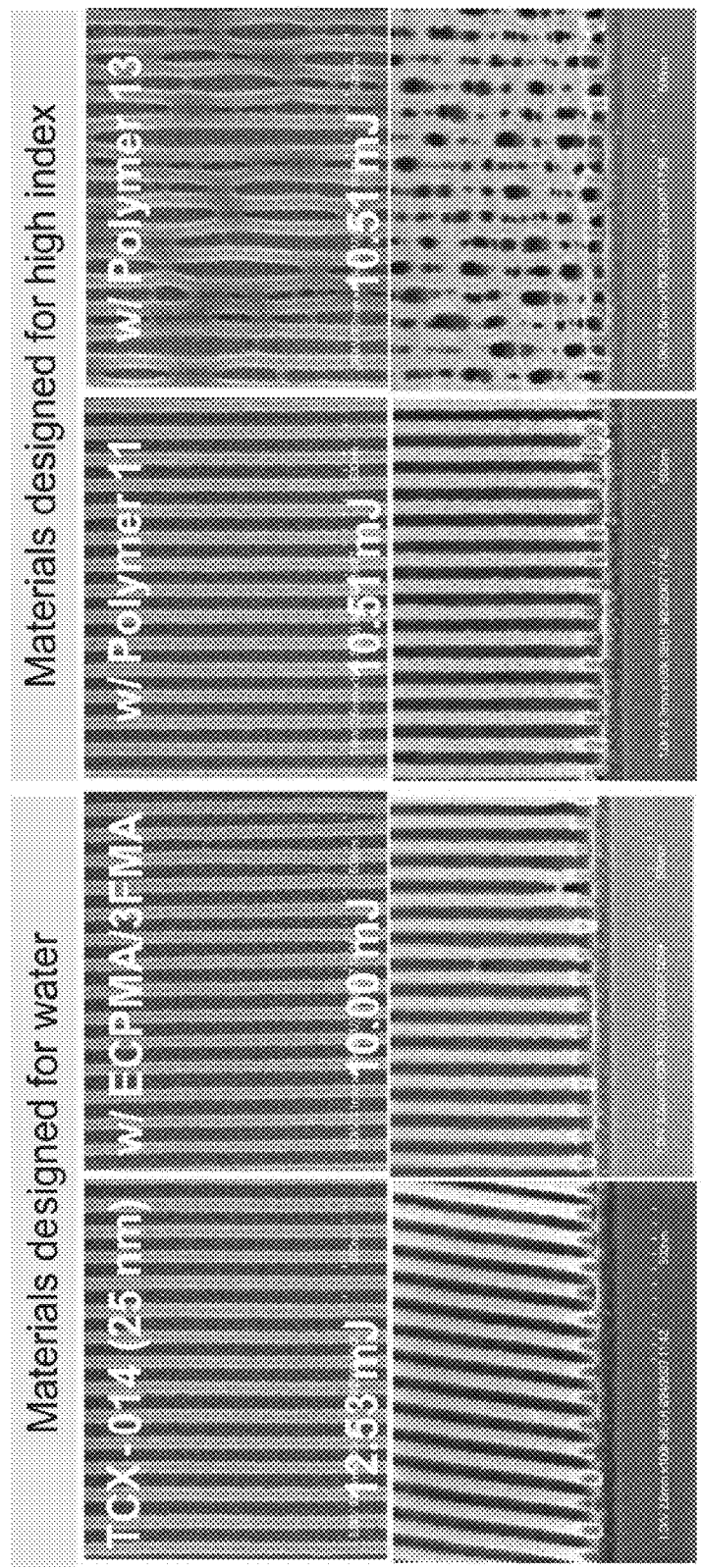
FIG. 10 shows immersion interference lithographic imaging results of two compositions of the present invention using high index immersion fluid.

To test the impact of these additives on the lithographic performance of a photoresist, selected additives were mixed with JSR AR1682J-10 (a typical 193 nm photoresist). Five weight percent of additive was added relative to the solids content of the photoresist solution. Films were spun cast onto silicon wafers coated with 780 Å of ARC29a (Brewer Science) at 3000 rpm for 30 seconds and baked at 110° C. for 90 seconds. Referring to FIG. 9, contrast curves were measured using open-field exposures imaged on an ISI 193 nm ministepper (0.6 NA). The exposed resist was baked at 110° C. for 90 seconds and then the patterns were puddle developed for 60 seconds using Optiyield CD (Air Products). The results are shown in FIG. 9. The results show that the presence of the additive has only minor impact on the contrast and dose-to-clear. 193 nm immersion interference lithography using JSR HIL-001 immersion fluid was used to further demonstrate the imaging performance of these materials as shown in FIG. 10. In this case, the composition with polymer 11 as an additive shows nice square profiles which are superior to the rounded profiles afforded by TCX-014 or the slightly t-topped profiles provided by the composition using the poly(1-ethyl cyclopentyl methacrylate-co-2,2,2-trifluoroethyl methacrylate (ECPMA/3FMA) (70:30) additive. The composition with polymer 13 as an additive does show extensive line bridging due to the high activation energy of the t-butyl protecting groups. Using a lower activation energy protecting group such as 1-ethyl cyclopentyl is expected to resolve this issue as is apparent to those skilled in the art.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A process for forming a photoresist image in a film on a substrate comprising:
   (a) coating a film comprising a photoresist polymer and a fluoropolymer additive comprising poly(3,5-bis(1,1,1,3,3,3-hexafluoroisopropan-2-ol-2-yl)cyclohexyl methacrylate-co-1,1,1,3,3,3-hexafluoroisoprop-2-yl trifluoromethacrylate-co-1,1,1,2,2,3,3,4,4-nonafluorohex-6-yl vinyl ether), wherein the fluoropolymer additive segregates to a surface of the film forming an enrichment layer over the film;
   (b) covering the film with a layer of decahydronaphthalene fluid, wherein the composition forms static receding contact angles of at least 30% with the hydrocarbon fluid;
   (c) imagewise exposing the film to 193 nm radiation; and
   (d) developing the image in the film.

* * * * *